United States Patent
Shih et al.

(10) Patent No.: US 6,829,322 B2
(45) Date of Patent: Dec. 7, 2004

(54) SHIFT-REGISTER CIRCUIT AND SHIFT-REGISTER UNIT

(75) Inventors: Jun-Ren Shih, Changhua (TW); Shang-Li Chen, Hsinchu (TW); Bo-Wen Wang, Taipei (TW); Jan-Ruei Lin, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/617,782

(22) Filed: Jul. 14, 2003

(65) Prior Publication Data

US 2004/0218710 A1 Nov. 4, 2004

(30) Foreign Application Priority Data

Apr. 29, 2003 (TW) .................................... 92109977 A (51) Int. Cl.[7] .............................................. G11C 19/00
(52) U.S. Cl. ........................ 377/78; 377/79; 345/95; 345/100
(58) Field of Search ................... 377/78, 79; 345/95, 345/100

(56) References Cited

U.S. PATENT DOCUMENTS 4,698,588 A * 10/1987 Hwang et al. ............. 324/73.1
6,437,768 B1 * 8/2002 Kubota et al. ............... 345/100

* cited by examiner

Primary Examiner—Margaret R. Wambach
(74) Attorney, Agent, or Firm—Birch, Stewart, Kolasch & Birch, LLP (57) ABSTRACT

A shift-register unit. The first transistor includes a first source/drain coupled to a first terminal, a second source/drain, and a first gate coupled to a reset signal to stop the shift-register unit outputting a pulse signal. The second transistor includes a third source/drain coupled to the second source/drain, a fourth source/drain coupled to a second terminal, and a second gate coupled to a setting signal to initial the shift-register unit. The third transistor includes a fifth source/drain coupled to an output terminal, a third gate coupled to the second source/drain and a sixth source/drain coupled to a clock signal to start outputting the pulse signal. The fourth transistor includes a seventh source/drain coupled to the first terminal, an eighth source/drain coupled to the output terminal and a fourth gate coupled to a refresh signal to set a voltage level of the shift-register unit in a standby mode.

28 Claims, 9 Drawing Sheets

SHIFT-REGISTER CIRCUIT AND SHIFT-REGISTER UNIT

BACKGROUND OF THE INVENTION

1. Field of the Invention

The present invention relates in general to a shift-register unit and a shift-register circuit comprising the shift-register units. In particular, the present invention relates to a shift-register unit using single-type transistors, such as P-type transistors or N-type transistors.

2. Description of the Related Art

A frame of a liquid crystal display (LCD) is generated by a plurality of pixels of the matrices. Thus, sequential pulses provided to the gate driver and data driver are basic signals for driving the LCD. In addition, the sequential pulses are generated by a shift-register circuit, so the shift register circuit is a general unit for the driving circuit of an LCD.

Figure 1A:
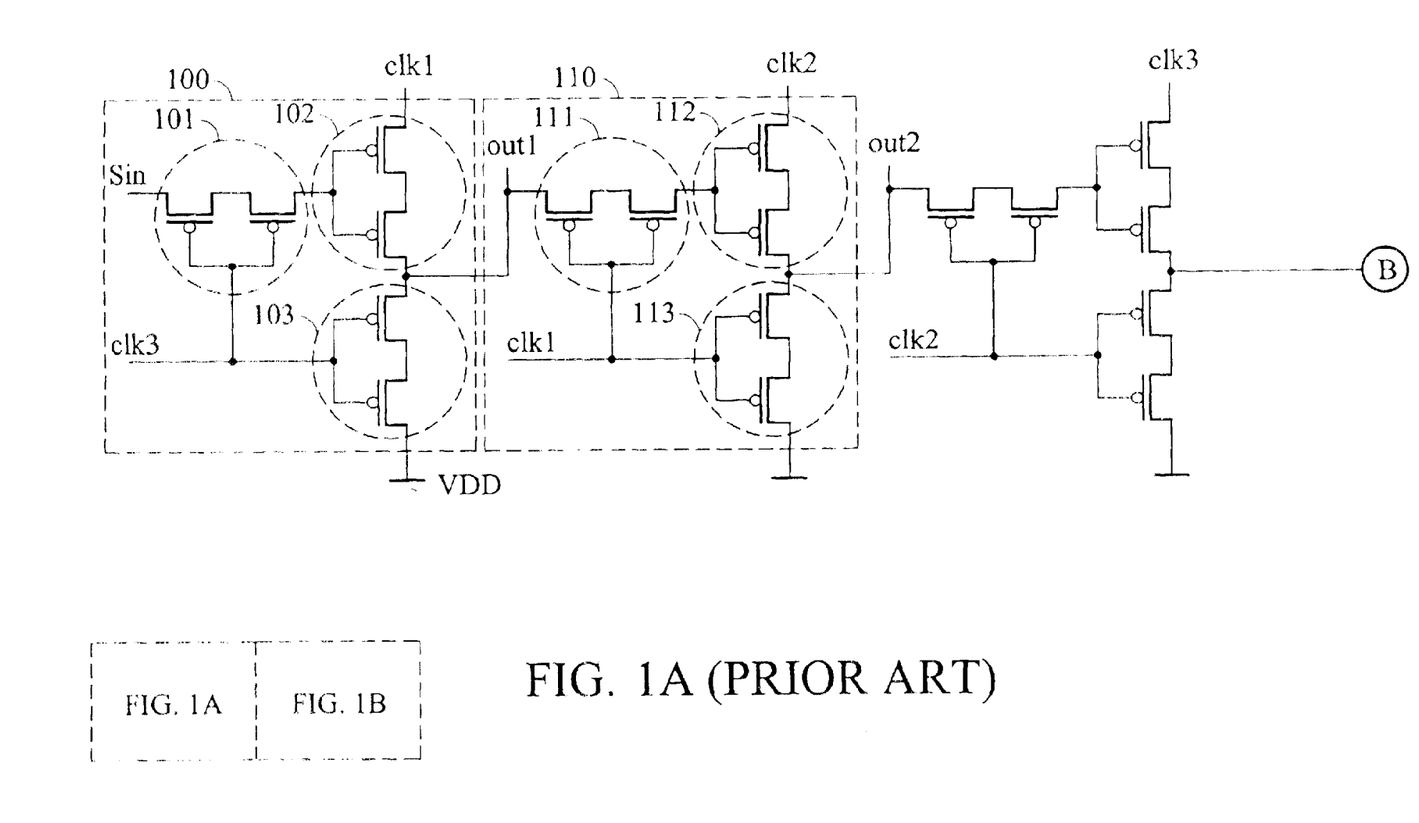
FIGS. 1A and 1B show a conventional shift-register circuit.
Figure 1B:
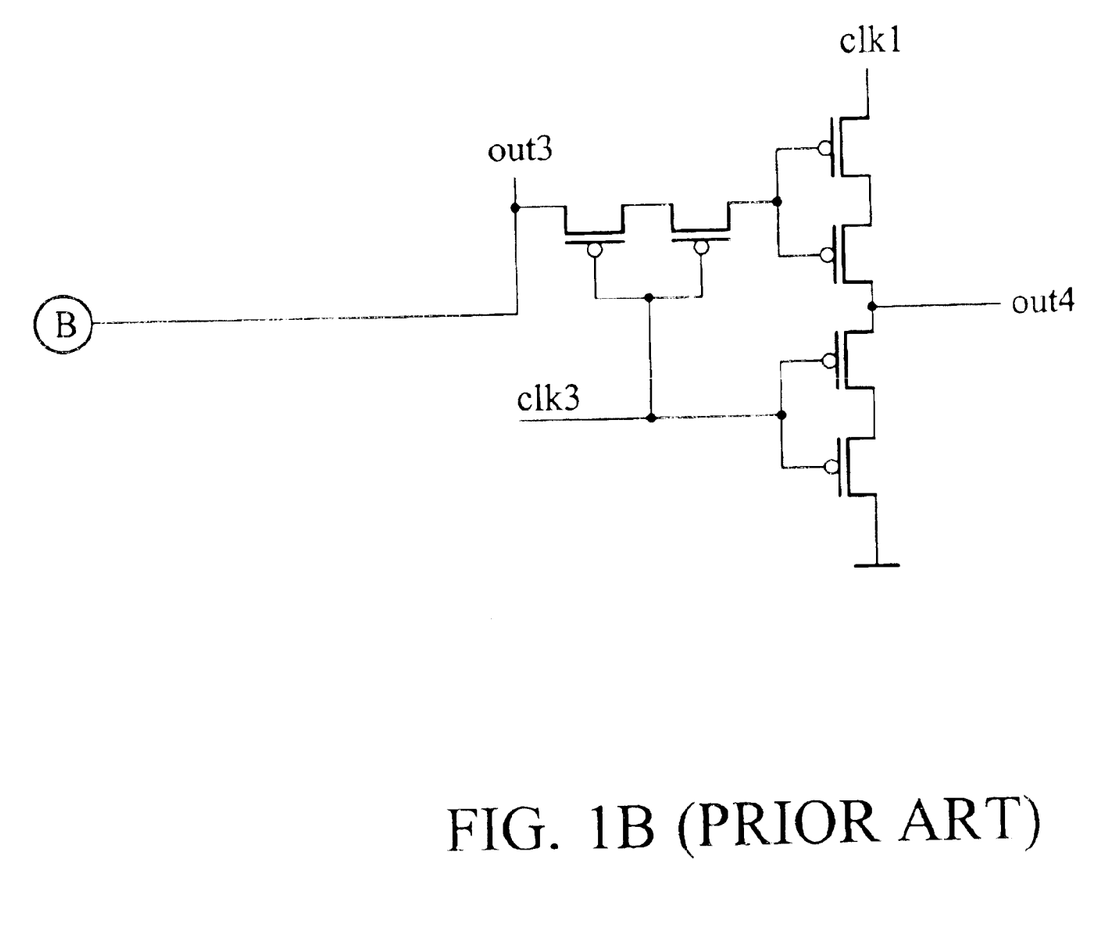
Figure 1C:
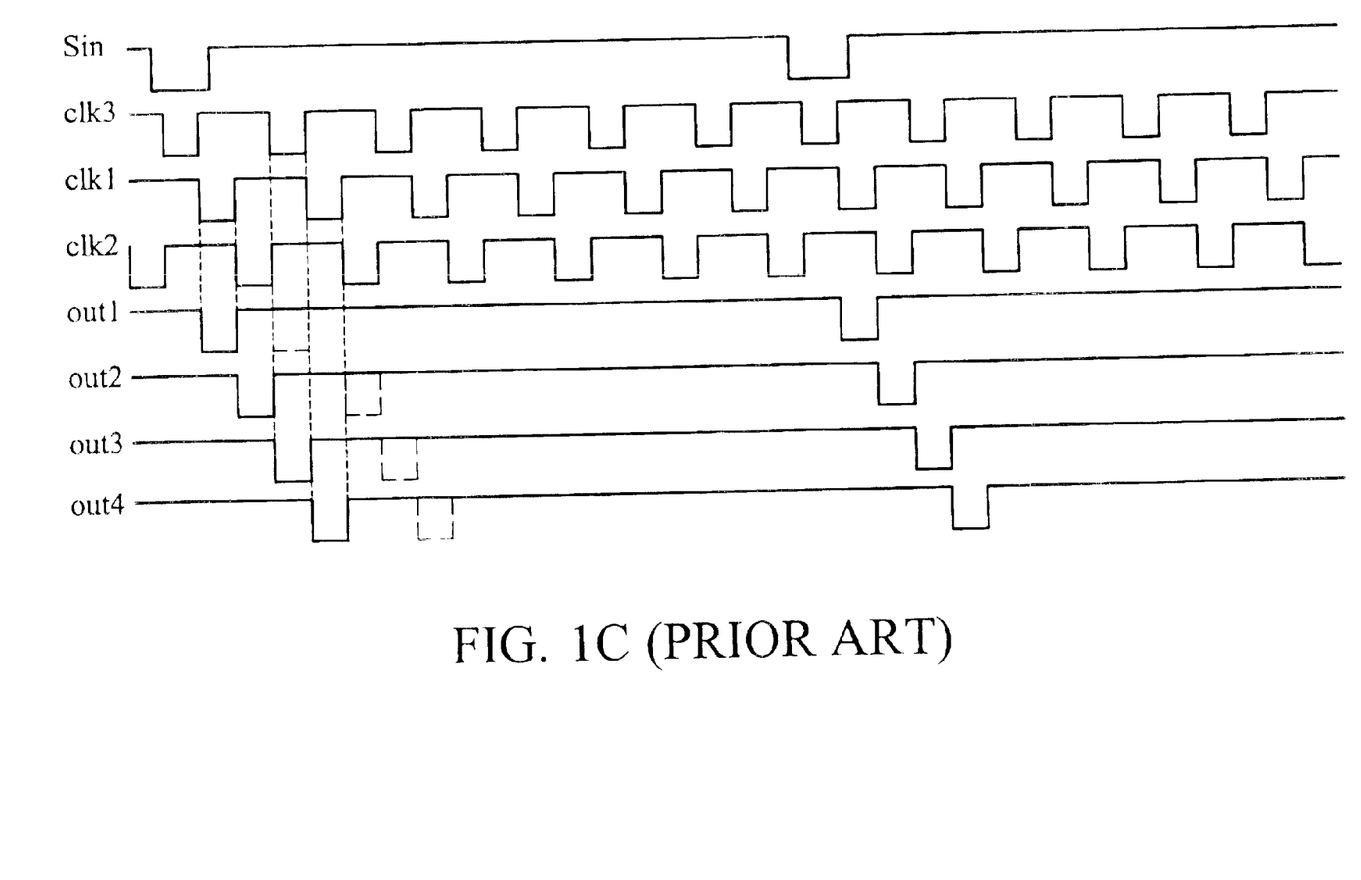
FIG. 1C shows the output signals out1, out2, out3 and out4 when the input signals Sin, clk1, clk2 and clk3 are input to the conventional shift-register circuit shown in FIGS. 1A and 1B.

FIGS. 1A and 1B show a conventional shift-register circuits. FIG. 1C shows the output signals out1, out2, out3 and out4 when the input signals Sin, clk1, clk2 and clk3 are input to the conventional shift-register circuit shown in FIGS. 1A and 1B.

In FIG. 1A, the transistors 101 and 103 of the first-stage shift-register unit 100 are turned on when the signal clk3 is at low voltage level. The transistor 102 is turned on when the signal Sin is at low voltage level. Thus, the waveform of the signal output from the output terminal out1 is the same as the clock signal clk1. The operation of others shift-register units are similar to the first-stage shift-register unit 100, thus, the description is omitted to simplify the description.

The voltage level of the output terminal out1 of the first-stage shift-register unit 100 maintains a high voltage level, thus, the signal Sin remains at a high voltage level. In addition, the transistor 103 is turned on when the clock signal clk3 drops to low voltage level, the output terminal is at high voltage level. Contrarily, the transistor 103 is turned off when the clock signal clk3 rises to high voltage level, the voltage level of the output terminal is floating.

The voltage level of the output terminal out1 does not maintain a high voltage level when the output terminal out1 is floating. Thus, error operation of the shift-register circuit occurs. The dotted lines of out1, out2, out3, and out4 in FIG. 1C represent error operation.

Figure 2:
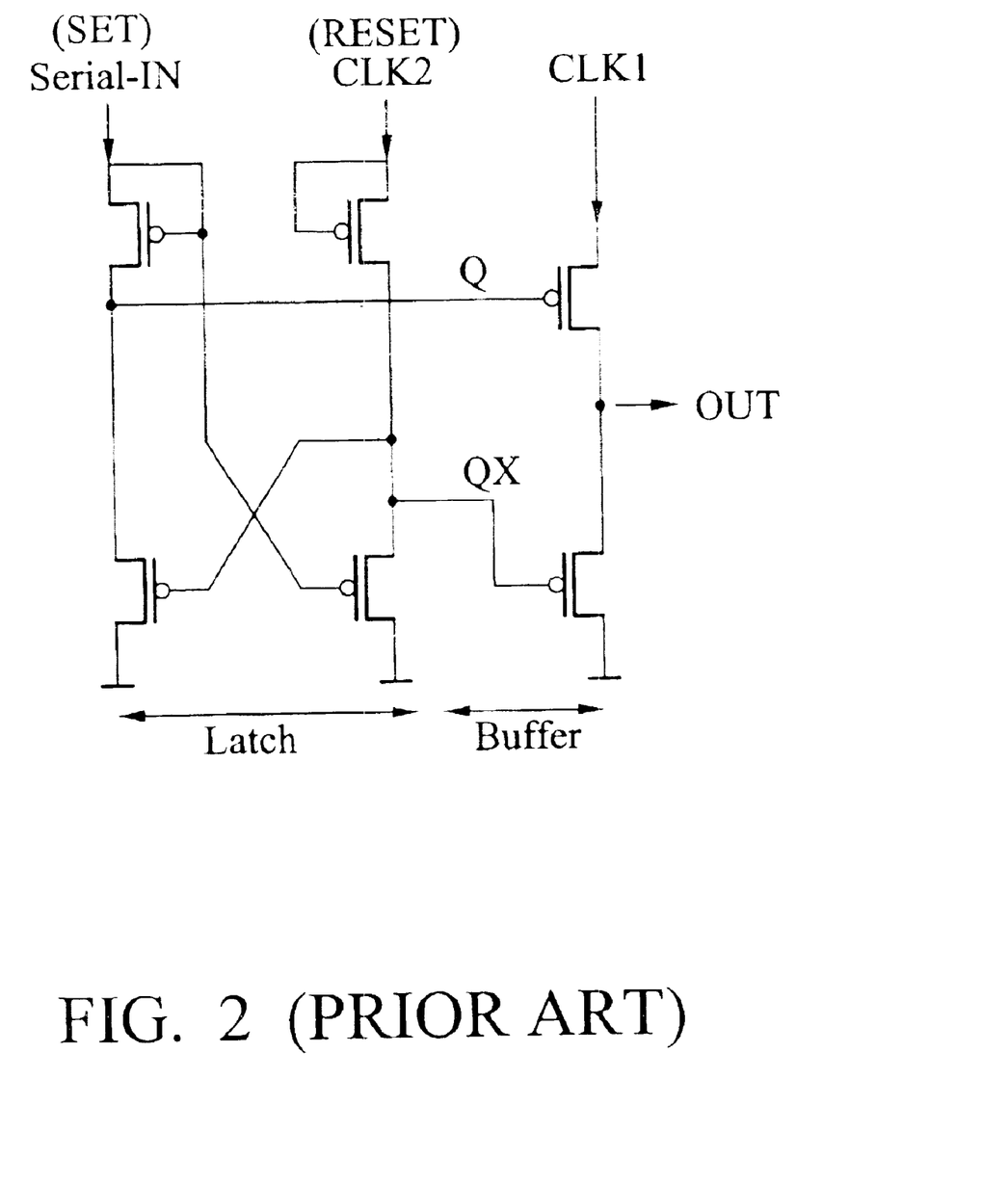
FIG. 2 shows another conventional shift-register circuit.

FIG. 2 shows another conventional shift-register circuit, which solves the floating problem mentioned above. However, the size of the shift-register circuit is large because more transistors are required.

Thus, the disadvantages of the conventional shift-register circuits are that error operation occurs due to the unstable signal level caused by floating, and the layout is complicated and the cost of the circuit is increased because more transistors are required.

SUMMARY OF THE INVENTION

The object of the present invention is to provide a shift-register circuit comprising single-type transistors to decrease the number of transistors, semiconductor process steps and layout area. Thus, the complication and cost of a circuit is reduced.

Another object of the present invention is thus to provide a shift-register circuit comprising thin film transistors to transmit full swing signals.

To achieve the above-mentioned object, the present invention provides a shift-register unit. The first transistor includes a first source/drain coupled to a first terminal, a second source/drain, and a first gate coupled to a reset signal to stop the shift-register unit outputting a pulse signal. The second transistor includes a third source/drain coupled to the second source/drain, a fourth source/drain coupled to a second terminal, and a second gate coupled to a setting signal to initial the shift-register unit. The third transistor includes a fifth source/drain coupled to an output terminal, a third gate coupled to the second source/drain and a sixth source/drain coupled to a clock signal to start outputting the pulse signal. The fourth transistor includes a seventh source/drain coupled to the first terminal, an eighth source/drain coupled to the output terminal and a fourth gate coupled to a refresh signal to set a voltage level of the shift-register unit in a standby mode.

In addition, the present invention provides a shift-register circuit. The first-stage shift-register unit, the final-stage shift-register unit and a plurality of middle-stage shift-register units connected between the first-stage shift-register unit and the final-stage shift-register unit are connected in serial and each shift-register unit outputs a pulse signal in sequence after the first-stage shift-register unit receiving an initial setting signal. The clock terminal for receiving a clock signal. The setting terminal receives a setting signal for trigging the shift-register unit to output the clock signal as the pulse signal. The reset terminal receives a reset signal to reset the shift-register unit to stop outputting the pulse signal. The reset terminals of the first-stage and the middle-stage shift-register units are respectively connected to the output signal of the subsequent stage shift-register unit, the reset terminal of the final-stage shift-register unit is connected to the output signal of the first-stage shift-register unit, the setting terminal of the middle-stage and the final-stage shift-register units are respectively connected to the output signal of the previous stage shift-register unit, the setting terminal of the first-stage shift-register unit is connected to the initial setting signal, the clock terminals of the odd stage shift-register units are connected to a first clock signal as the clock signal and the clock terminals of the even stage shift-register units are connected to a second clock signal as the clock signal.

In addition, the present invention provides another shift-register circuit. The first-stage shift-register unit, the second-stage shift-register unit, and the third-stage shift-register unit are connected in serial. Each shift-register unit outputs a pulse signal in sequence after the first-stage shift-register unit receiving an initial setting signal. The clock terminal receives a clock signal. The setting terminal receives a setting signal for trigging the shift-register unit to output the clock signal as the pulse signal. The reset terminal receives a reset signal to reset the shift-register unit to stop outputting the pulse signal. The reset terminals of the first-stage and the second-stage shift-register units are respectively connected to the output signal of the subsequent stage shift-register unit. The setting terminal of the second-stage and the third-stage shift-register units are respectively connected to the output signal of the previous stage shift-register unit. The setting terminal of the first-stage shift-register unit is connected to the initial setting signal, the clock terminal of the first-stage shift-register unit is connected to a first clock signal as the clock signal, the clock terminal of the second-stage shift-register unit is connected to a second clock signal as the clock signal and the clock terminal of the third-stage shift-register unit is connected to a third clock signal as the clock signal.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 3A:
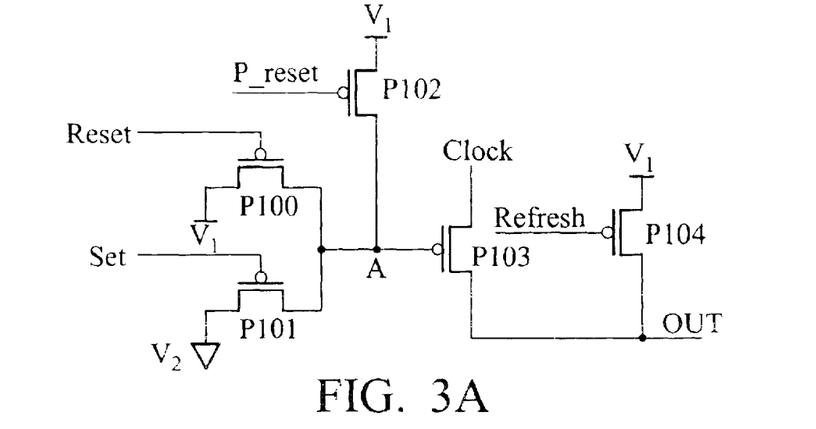
FIG. 3A shows a shift-register circuit comprising P-type transistors according to the first embodiment of the present invention.

FIG. 3A shows a shift-register circuit comprising P-type transistors according to the first embodiment of the present invention. The first source/drain of the transistor P100 is coupled to a first terminal $V_1$ and the gate of the transistor. P100 receives a reset signal Reset to stop the shift-register unit outputting pulses. The first source/drain of the transistor P101 is coupled to the second source/drain of the transistor P100, the second source/drain of the transistor P101 is coupled to a second terminal $V_2$, and the gate of the transistor P101 is coupled to a setting signal Set to start the shift-register unit.

The gate of the transistor P103 is coupled to the second source/drain of the transistor P100, the first source/drain of the transistor P103 receives a clock signal Clock to enable the shift-register unit to output the pulse and the second source/drain of the transistor P103 is coupled to an output terminal OUT. The first source/drain of the transistor P104 is coupled to the first terminal $V_1$, the second source/drain of the transistor P104 is coupled to the output terminal OUT and the gate of the transistor P104 receives a refresh signal Refresh to set the voltage level of the shift-register unit in standby mode.

The first source/drain of the transistor P102 is coupled to the first terminal $V_1$, the second source/drain of the transistor P102 is coupled to the second source/drain of the transistor P100 and the gate of the transistor P102 reset a preset signal P_reset to set the voltage level of the transistor P103.

The voltage level of the first terminal $V_1$ exceeds that of the second terminal $V_2$, because the transistors P100, P101, P102, P103 and P104 are P-type transistors, which are thin film transistors or MOS transistors.

Figure 3B:
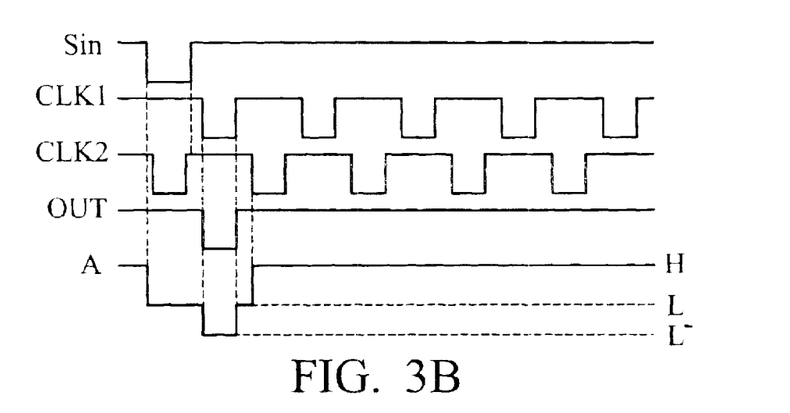
FIG. 3B shows a timing chart of the shift-register unit using P-type transistors according to the embodiment of the present invention.

FIG. 3B shows a timing chart of the shift-register unit using P-type transistors according to the embodiment of the present invention. In FIG. 3B, the signal Sin represents the setting signal Set, the first clock signal CLK1 represents the clock signal Clock and the second clock signal CLK2 represents the refresh signal Refresh.

The voltage level of the output terminal OUT is at high voltage level when the second clock signal, CLK2 drops to low voltage level. The transistor P101 is turned on when the signal Sin drops to low voltage level. Thus, the voltage level of the terminal A is low and the transistor P103 is turned on. When the first clock signal CLK1 drops to low voltage level, the voltage level of the output terminal OUT also drops to low voltage level and make the voltage level of the terminal A drop to a lower voltage. Thus, low voltage is transmitted. That is, the shift-register circuit using thin film transistors is able to transmit full swing signal; which comprises the range between the highest and the lowest voltage level of the signal.

When the first clock CLK1 rises to high voltage level, the voltage level of the terminal A rises from negative to low voltage level and the voltage level of the output terminal OUT rises to high voltage level. The voltage level of the output terminal OUT maintains at high voltage level because the transistor P104 is turned on when the voltage level of the second clock signal CLK2 drops to low voltage.

Figure 3C:
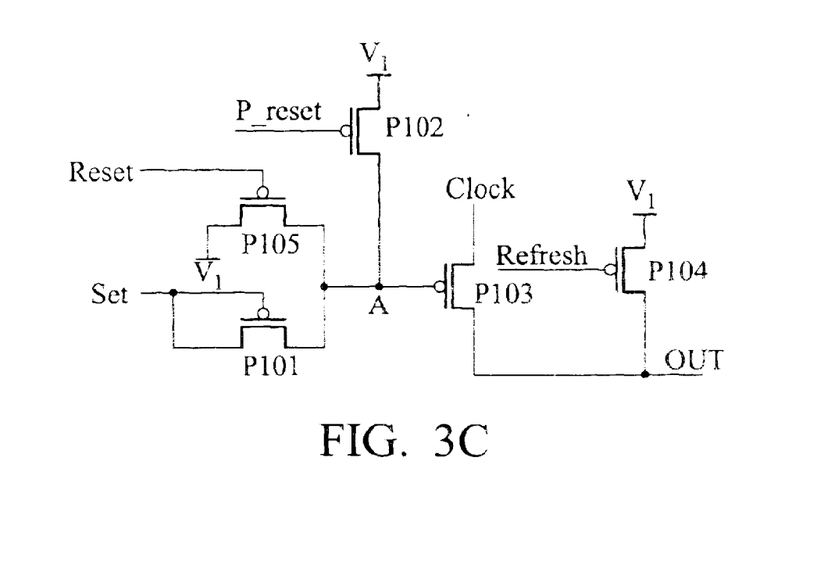
FIG. 3C shows a shift-register unit composed of P-type transistors according to the second embodiment of the present invention.

FIG. 3C shows a shift-register unit composed of P-type transistors according to the second embodiment of the present invention. The elements the same as that in FIG. 3A use the same labels to simplify the description. The difference between the first embodiment and the second embodiment is that the second source/drain of the transistor P105 of the second embodiment is coupled to the setting signal Set to prevent voltage differential between the first and second sources/drains of the transistor P105 for an extended period and cause electric leakage and error operation.

Figure 4A:
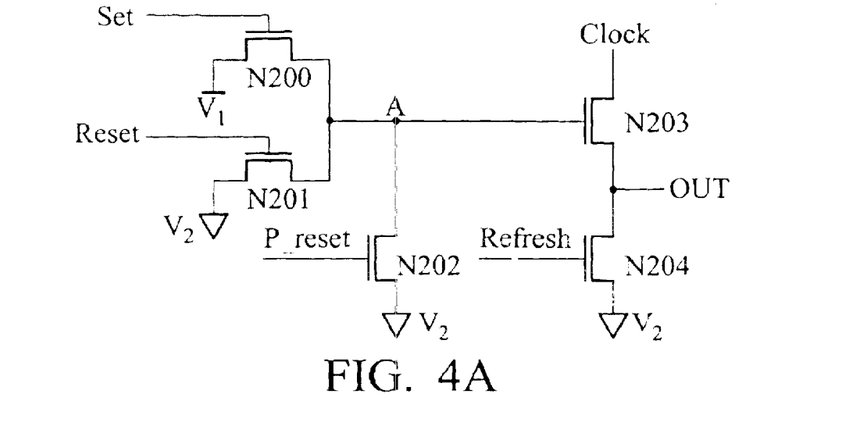
FIG. 4A shows a shift-register unit composed of N-type transistors.

FIG. 4A shows a shift-register unit composed of N-type transistors N220, N201, N202, N203 and N204. Here, the voltage level of the first terminal $V_1$ is lower than that of the second terminal $V_2$.

Figure 4B:
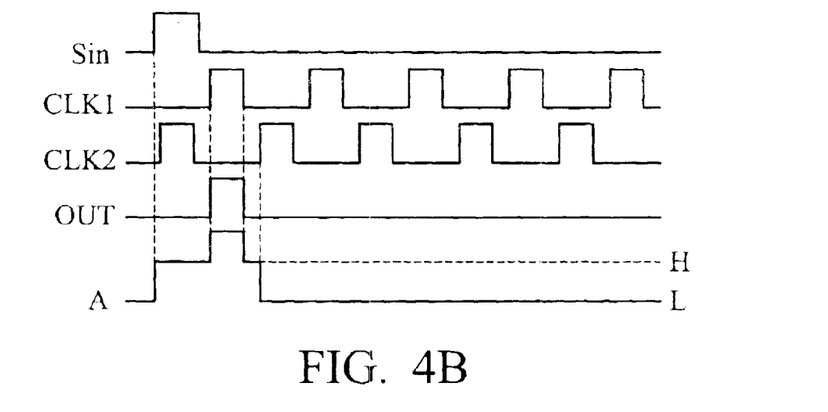
FIG. 4B shows a timing chart of the shift-register unit using N-type transistors according to the embodiment of the present invention.

FIG. 4B shows a timing chart of the shift-register unit using N-type transistors according to the embodiment of the present invention. In FIG. 4B, the timing and the voltage levels of the signals are inverted to the signals shown in FIG. 3B.

Figure 4C:
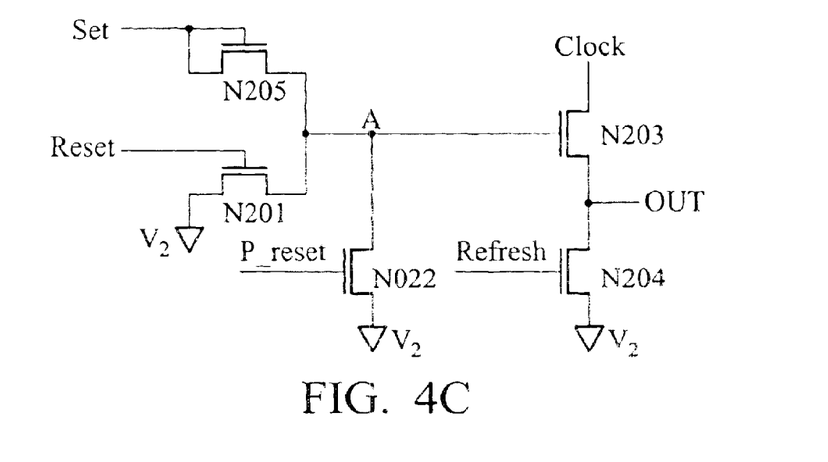
FIG. 4C shows a shift-register unit composed of N-type transistors of the present invention.

FIG. 4C shows a shift-register unit composed of N-type transistors of the present invention. The difference between the circuits shown in FIGS. 4C and 4A is that the second source/drain of the transistor NN05 in FIG. 4C is coupled to the setting signal Set to prevent a voltage difference between the first and second sources/drains of the transistor N205 for an extended period and cause electric leakage and error operation.

The shift-register units according to the present invention comprising N-type transistors or P-type transistors comprise a multi-stages shift-register circuit. A four stage shift-register circuit is described in the following.

Figure 5A:
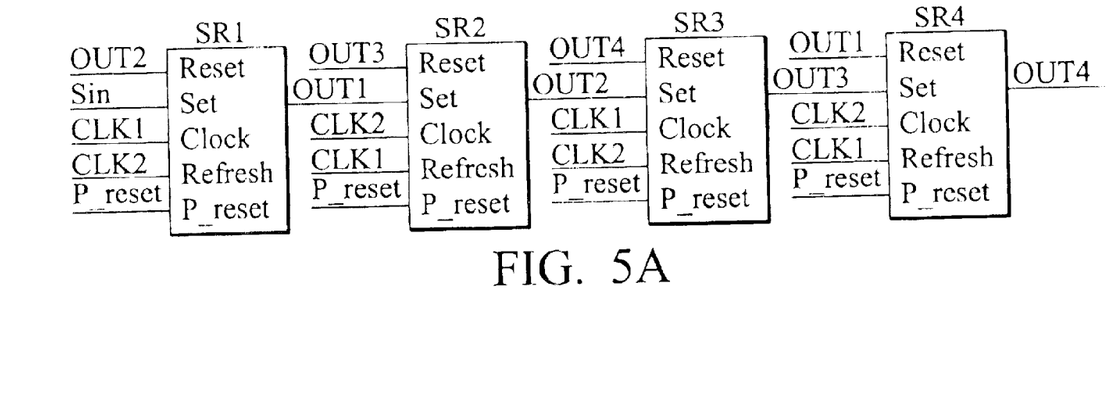
FIG. 5A shows the four stage shift-register circuit according to the first embodiment of the present invention.

FIG. 5A shows the four stage shift-register circuit according to the first embodiment of the present invention. The labels SR1~SR4 represent shift-register units from the first stage to the fourth stage. The shift-register units SR1~SR4 are connected in serial. After the first-stage shift-register unit SR1 receives an initial signal Sin, the shift-register units SR1~SR4 respectively output pulses in sequence.

Each shift-register unit comprises a clock terminal Clock to receive a clock signal, a setting terminal for receiving a setting signal to drive the shift-register unit to output the clock signal as the pulse signal, a reset terminal Reset for receiving a reset signal to reset the shift-register unit and suspend outputting the pulse signal, a refresh terminal Refresh to receive a refresh signal and a P_reset terminal for receiving a preset signal to set the voltage output by the shift-register unit in standby mode.

The reset terminal Reset of each shift-register unit is coupled to the output signal of the subsequent stage shift-register unit. In addition; the reset terminal Reset of the final-stage shift-register unit is coupled to the output signal of the first-stage shift-register unit.

The setting terminal Set of each shift-register unit is coupled to the output signal of the previous stage shift-register unit. The setting terminal Set of the first-stage shift-register unit receives the initial signal Sin.

The clock terminals Clock of the odd stage shift-register units (SR1 and SR3) and the even stage shift-register units (SR2 and SR4) are coupled to the first clock signal CLK1 and the second clock signal CLK2, respectively. In addition, the refresh terminals Refresh of the odd stage shift-register units (SR1 and SR3) and the even stage shift-register units (SR2 and SR4) are coupled to the second clock signal CLK2 and the first clock signal CLK1, respectively. Moreover, the preset terminals P_reset of all shift-register units are coupled to a preset signal to control whether the outputting of the clock signals of each shift-register unit or not.

Figure 5B:
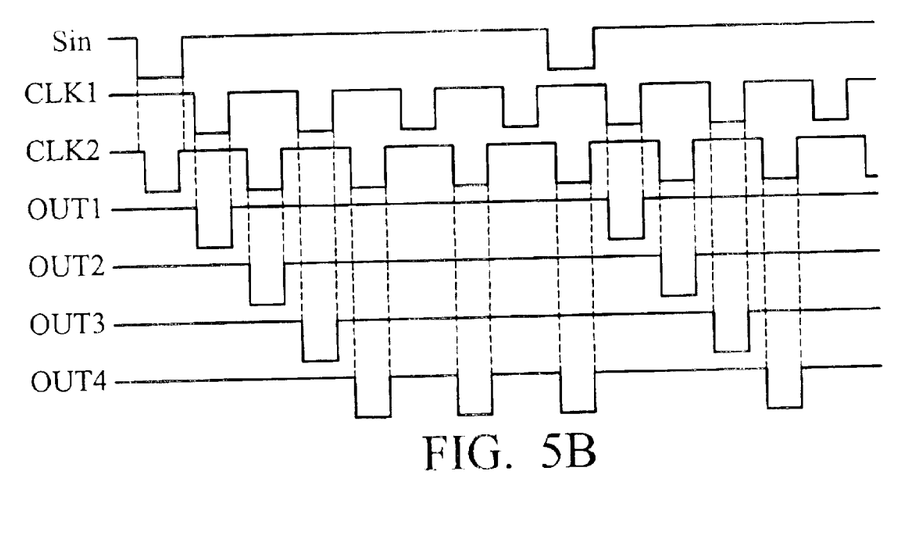
FIG. 5B shows a timing chart of the four stage shift-register circuit according to the first embodiment of the present invention.

FIG. 5B shows a timing chart of the four stage shift-register circuit according to the first embodiment of the present invention. After the initial setting signal Sin inputting the four stage shift-register circuit according to the first embodiment of the present invention, each shift-register unit outputs a clock pulse in sequence. In addition, the interval between the clock pulses output by the shift-register units is a clock period.

However, the reset terminal Reset of the final-stage shift-register unit SR4 is coupled to the output terminal OUT1 of the first-stage shift-register unit SR1, since the first-stage shift-register unit SR1 is not trigged by the initial signal Sin, the output terminal OUT4 of the final-stage shift-register unit SR4 is not reset and will be trigged by the second clock signal CLK2. Thus, error pulse is output by the final-stage shift-register unit SR4.

Figure 6:
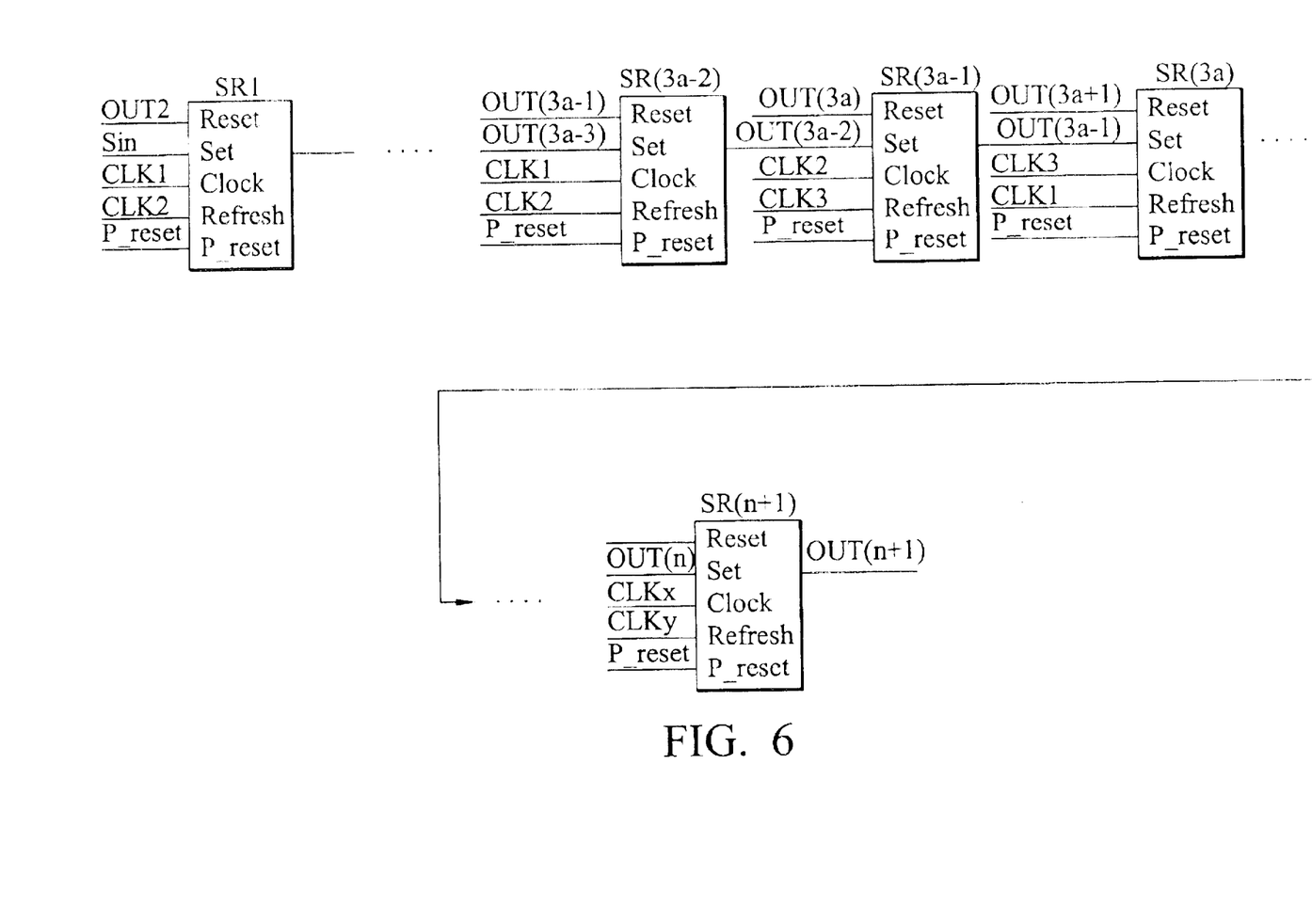
FIG. 6 shows a multi-stage shift-register circuit.

FIG. 6 shows a multi-stage shift-register circuit. Each shift-register unit can be the shift-register unit shown in FIGS. 3A and 3C or FIGS. 4A and 4C. To solve the problem of the late of the initial setting signal Sin trigging the first-stage shift-register unit SR1, an additional shift-register unit is set. For example, a four stage shift-register circuit is modified to a five stage shift-register circuit. Thus, the multi-stage shift-register circuit comprises shift-register units SR1~SRn+1 connected in serial. After the initial setting signal Sin inputting the five-stage shift-register circuit, each shift-register unit (SR1~SRn+1) outputs a clock pulse in sequence.

Assuming the multi-stage shift-register circuit comprises n+1 shift-register units, the reset terminal Reset of the kth-stage shift-register unit SRk ($1 \leq k < n+1$) is connected to the output signal of the (k+1)th-stage shift-register unit SR(k+1).

The setting terminal Set of the jth-stage shift-register unit SRj ($1 \leq j < n+1$) is connected to the output signal of the (j−1)th-stage shift-register unit SR(j−1). The setting terminal Set of the first-stage shift-register unit SR1 is coupled to the initial setting signal Sin.

The clock terminals Clock of the (3a−2)th-stage shift-register units are coupled to the first clock signal, the clock terminals Clock of the (3a−1)th-stage shift-register units are coupled to the second clock signal, and the clock terminals Clock of the (3a)th-stage shift-register units are coupled to the third clock signal.

The refresh terminals Refresh of the (3a−2)th-stage shift-register units are coupled to the second clock signal, the refresh terminals Refresh of the (3a−1)th-stage shift-register units are coupled to the third clock signal, and the refresh terminals Refresh of the (3a)th-stage shift-register units are coupled to the first clock signal.

The clock terminal Clock of the (n+1)th-stage shift-register unit SRn+1 is coupled to the clock signal CLKx and the refresh terminal Refresh of the (n+1)th-stage shift-register unit SRn+1 is coupled to the clock signal CLKy, wherein the CLKx and CLKy are selected from both of the clock signals CLK1, CLK1, and CLK3. When (n+1)mod(3a) is 0, x is '3' and y is '2'; when (n+1)mod(3a) is 1, x is '1' and y is '2'; and when (n+1)mod(3a) is 2, x is '2' and y is '3'.

The preset terminals of the shift-register units SR1~SRn+1 are all connected to a preset signal to determine whether the clock signals are output or not.

Figure 7A:
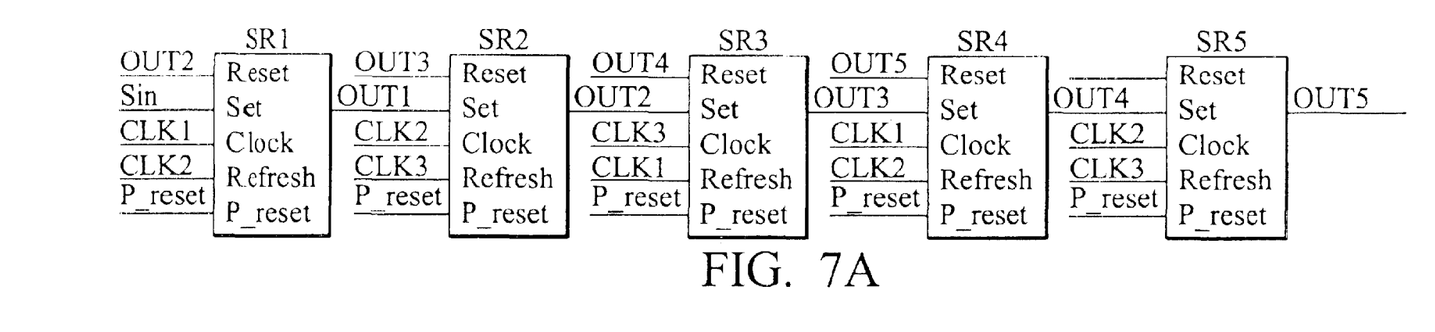
FIG. 7A shows a four stage shift-register circuit according to the second embodiment of the present invention.

FIG. 7A shows a four stage shift-register circuit according to the second embodiment of the present invention. To solve the problem of the late of the initial setting signal Sin trigging the first-stage shift-register unit SR1, an additional fifth-stage shift-register unit SR5 is set, which comprises an output terminal OUT5 connected to the reset terminal Reset of the fourth-stage shift-register unit SR4.

The reset terminal Reset of the each shift-register unit is connected to the output signal of the subsequent stage shift-register unit. The preset terminals of the shift-register units are all connected to a preset signal to determine whether the clock signals are output or not.

The setting terminal Set of each shift-register unit is connected to the output signal of the previous stage shift-register unit. The setting terminal Set of the first-stage shift-register unit SR1 is coupled to the initial setting signal Sin.

When a=1, thus SR(3a−2) is SR1, SR(3a−1) is SR2 and SR(3a) is SR3. The clock terminal Clock of the first-stage shift-register unit SR1 is coupled to the first clock signal CLK1 and the refresh terminal Refresh of the first-stage shift-register unit SR1 is coupled to the second clock signal CLK2. The clock terminal Clock of the second-stage shift-register unit SR2 is coupled to the second clock signal CLK2 and the refresh terminal Refresh of the second-stage shift-register unit SR2 is coupled to the third clock signal CLK3. The clock terminal Clock of the third-stage shift-register unit SR3 is coupled to the third clock signal CLK3 and the refresh terminal Refresh of the third-stage shift-register unit SR3 is coupled to the first clock signal CLK1.

When a=2, thus SR(3a−2) is SR4, the connection of the clock terminal Clock and the refresh terminal Refresh fourth-stage shift-register unit SR4 is the same as the first-stage shift-register unit SR1. In addition, SR(3a−1) is SR5, the connection of the clock terminal Clock and the refresh terminal Refresh fifth-stage shift-register unit SR5 is the same as the first-stage shift-register unit SR2. The connections of other shift-register units follow the theorem described above.

Figure 7B:
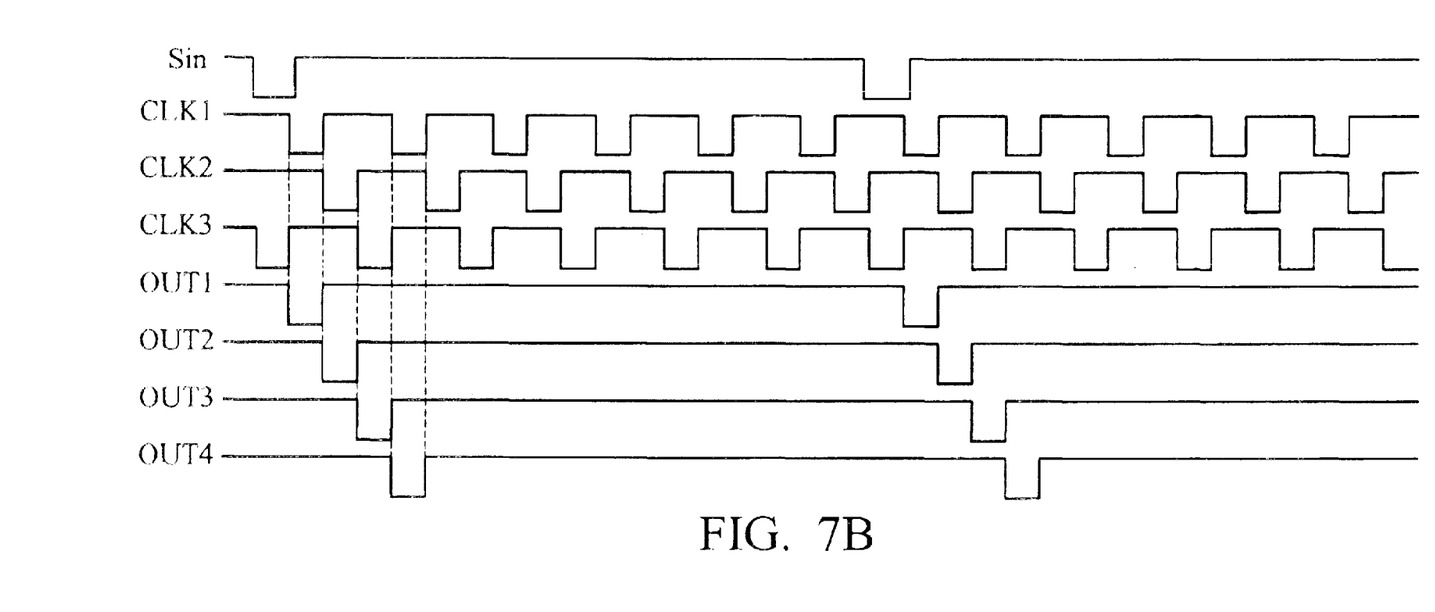
FIG. 7B shows a timing chart of the four stage shift-register circuit according to the second embodiment of the present invention.

FIG. 7B shows a timing chart of the four stage shift-register circuit according to the second embodiment of the present invention. After the initial setting signal Sin inputting the four stage shift-register circuit according to the second embodiment of the present invention, each shift-register unit outputs a clock pulse in sequence. In addition the interval between the clock pulses output by the shift-register units is a clock period.

Here, the reset terminal Reset of the fourth stage shift-register unit SR4 is connected to the output terminal OUT5 of the fifth-stage shift-register unit SR5. Thus, the fourth stage shift-register unit SR4 stops outputting the pulse signal until the setting terminal Set receives the reset signal to ensures that the shift-register units SR1~SR5 output pulse signals in sequence.

In addition, the frequency of the first clock signal, the second clock signal, and the third clock signal is the same but with a different duty cycle. Moreover, the shift-register units shown in the FIGS. 4A and 4B may comprise the multi-stage shift-register circuit according to the present invention.

Accordingly, the advantages of the multi-stage shift-register circuit according to the present invention are that the shift-register circuit comprises signal type transistors, the reliability is improved by the accurate reset operation, the cost is reduced by requiring less circuit elements and signals with full swing are transmitted by thin film transistors.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A shift-register unit, comprising:
 a first transistor having a first source/drain coupled to a first terminal, a second source/drain, and a first gate coupled to a reset signal to stop the shift-register unit outputting a pulse signal;
 a second transistor having a third source/drain coupled to the second source/drain, a fourth source/drain coupled to a second terminal, and a second gate coupled to a setting signal to an initial shift-register unit;
 a third transistor having a fifth source/drain coupled to an output terminal, a third gate coupled to the second source/drain and a sixth source/drain coupled to a clock signal to start outputting the pulse signal; and
 a fourth transistor having a seventh source/drain coupled to the first terminal, an eighth source/drain coupled to the output terminal and a fourth gate coupled to a refresh signal to set a voltage level of the shift-register unit in a standby mode.

2. The shift-register unit as claimed in claim 1, further comprising a fifth transistor having a ninth source/drain coupled to the first terminal, a tenth source/drain coupled to the second source/drain and a fifth gate coupled to a preset signal to set a voltage level of the third gate.

3. The shift-register unit as claimed in claim 2, wherein the transistors are p-type transistors and the first terminal is coupled to a power source and the second terminal is coupled to the setting signal.

4. The shift-register unit as claimed in claim 2, wherein the transistors are p-type transistors and the voltage level of the first terminal exceeds that of the second terminal.

5. The shift-register unit as claimed in claim 2, wherein the transistors are n-type transistors and the first terminal is coupled to a ground level and the second terminal is coupled to the setting signal.

6. The shift-register unit as claimed in claim 2, wherein the transistors are n-type transistors and the voltage level of the second terminal exceeds that of the first terminal.

7. The shift-register unit as claimed in claim 1, wherein the transistors are thin film transistors.

8. The shift-register unit as claimed in claim 1, wherein the transistors are MOS transistors.

9. A shift-register circuit, comprising:
 a first-stage shift-register unit, a final-stage shift-register unit and a plurality of middle-stage shift-register units connected between the first-stage shift-register unit and the final-stage shift-register unit, wherein the shift-register units are connected in serial and each shift-register unit outputs a pulse signal in sequence after the first-stage shift-register unit receives an initial setting signal;
 each shift-register unit comprising:
 a clock terminal for receiving a clock signal;
 a setting terminal for receiving a setting signal for triggering the shift-register unit to output the clock signal as the pulse signal; and
 a reset terminal for receiving a reset signal to reset the shift-register unit to stop outputting the pulse signal, wherein the reset terminals of the first-stage and the middle-stage shift-register units are respectively connected to the pulse signal of a shift-register unit of a subsequent stage, the reset terminal of the final-stage shift-register unit is connected to the pulse signal of the first-stage shift-register unit, the setting terminal of the middle-stage and the final-stage shift-register units are respectively connected to the pulse signal of a shift-register unit of a previous stage, the setting terminal of the first-stage shift-register unit is connected to the initial setting signal, the clock terminals of shift-register units of odd stages are connected to a first clock signal as the clock signal, and the clock terminals of shift-register units of even stages are connected to a second clock signal as the clock signal.

10. The shift-register circuit as claimed in claim 9, wherein the shift-register unit comprises:
 a first transistor having a first source/drain coupled to a first terminal, a second source/drain, and a first gate coupled to the reset terminal;

a second transistor having a third source/drain coupled to the second source/drain, a fourth source/drain coupled to a second terminal, and a second gate as the setting terminal; and a third transistor having a fifth source/drain coupled to an output terminal, a third gate coupled to the second source/drain and a sixth source/drain as the clock terminal.

11. The shift-register circuit as claimed in claim 10, wherein the shift-register unit further comprises:

a fourth transistor having a seventh source/drain coupled to the first terminal, an eighth source/drain coupled to the output terminal and a fourth gate as a refresh terminal coupled to a refresh signal to set a voltage level of the shift-register unit in a standby mode; and a fifth transistor having a ninth source/drain coupled to the first terminal, a tenth source/drain coupled to the second source/drain and a fifth gate as a preset terminal to set a voltage level of the third gate, wherein the refresh terminals of the even stage shift-register units are coupled to the first clock signal, and the refresh terminals of the odd stage shift-register units are coupled to the second clock signal.

12. The shift-register circuit as claimed in claim 11, wherein the first and the second clock signals have the same frequency and different duty cycles.

13. The shift-register circuit as claimed in claim 12, wherein the transistors are p-type transistors and the first terminal is coupled to a power source and the second terminal is coupled to the setting signal.

14. The shift-register unit as claimed in claim 12, wherein the transistors are p-type transistors and the voltage level of the first terminal exceeds that of the second terminal.

15. The shift-register unit as claimed in claim 12, wherein the transistors are n-type transistors and the first terminal is coupled to a ground level and the second terminal is coupled to the setting signal.

16. The shift-register unit as claimed in claim 12, wherein the transistors are n-type transistors and the voltage level of the second terminal exceeds that of the first terminal.

17. The shift-register unit as claimed in claim 10, wherein the transistors are thin film transistors.

18. The shift-register unit as claimed in claim 10, wherein the transistors are MOS transistors.

19. A shift-register circuit, comprising:

a first-stage shift-register unit, a second-stage shift-register unit, a third-stage shift-register unit and a fourth-stage shift-register unit connected in serial, wherein each shift-register unit outputs a pulse signal in sequence after the first-stage shift-register unit receives an initial setting signal;

each shift-register unit comprising:

a clock terminal for receiving a clock signal;

a setting terminal for receiving a setting signal for triggering the shift-register unit to output the clock signal as the pulse signal; and a reset terminal for receiving a reset signal to reset the shift-register unit to stop outputting the pulse signal, wherein the reset terminals of the first-stage, the second-stage and the third-stage shift-register units are respectively connected to the pulse signal of a shift-register unit of a subsequent stage, the setting terminal of the second-stage, the third-stage and the fourth stage shift-register units are respectively connected to the pulse signal of a shift-register unit of a previous stage, the setting terminal of the first-stage shift-register unit is connected to the initial setting signal, the clock terminals of the first-stage and the fourth-stage shift-register units are connected to a first clock signal as the clock signal, the clock terminal of the second-stage shift-register unit is connected to a second clock signal as the clock signal and the clock terminal of the third-stage shift-register unit is connected to a third clock signal as the clock signal.

20. The shift-register circuit as claimed in claim 19, wherein the shift-register unit comprises:

a first transistor having a first source/drain coupled to a first terminal, a second source/drain, and a first gate coupled to the reset terminal;

a second transistor having a third source/drain coupled to the second source/drain, a fourth source/drain coupled to a second terminal, and a second gate as the setting terminal; and a third transistor having a fifth source/drain coupled to an output terminal, a third gate coupled to the second source/drain and a sixth source/drain as the clock terminal.

21. The shift-register circuit as claimed in claim 20, wherein the shift-register unit further comprises:

a fourth transistor having a seventh source/drain coupled to the first terminal, an eighth source/drain coupled to the output terminal and a fourth gate as a refresh terminal coupled to a refresh signal to set a voltage level of the shift-register unit in a standby mode; and a fifth transistor having a ninth source/drain coupled to the first terminal, a tenth source/drain coupled to the second source/drain and a fifth gate as a preset terminal to set a voltage level of the third gate, wherein the refresh terminal of the first-stage shift-register unit is coupled to the first clock signal, the refresh terminal of the second-stage shift-register unit is coupled to the second clock signal and the refresh terminal of the third-stage shift-register unit is coupled to the third clock signal.

22. The shift-register circuit as claimed in claim 21, wherein the first, the second and the third clock signals have the same frequency and different duty cycles.

23. The shift-register circuit as claimed in claim 22, wherein the transistors are p-type transistors and the first terminal is coupled to a power source and the second terminal is coupled to the setting signal.

24. The shift-register unit as claimed in claim 22, wherein the transistors are p-type transistors and the voltage level of the first terminal exceeds that of the second terminal.

25. The shift-register unit as claimed in claim 22, wherein the transistors are n-type transistors and the first terminal is coupled to a ground level and the second terminal is coupled to the setting signal.

26. The shift-register unit as claimed in claim 22, wherein the transistors are n-type transistors and the voltage level of the second terminal exceeds that of the first terminal.

27. The shift-register unit as claimed in claim 20, wherein the transistors are thin film transistors.

28. The shift-register unit as claimed in claim 20, wherein the transistors are MOS transistors.

* * * * *